(12) United States Patent
Roeper et al.

(10) Patent No.: US 8,828,333 B2
(45) Date of Patent: Sep. 9, 2014

(54) METHOD FOR THE PRODUCTION OF A MICROFLUIDIC SYSTEM ON A POLYMER SURFACE

(75) Inventors: Josef Roeper, Neuhofen (DE); Eva Urlaub, Dienheim (DE); Werner Finke, Einhausen (DE)

(73) Assignee: Roche Diagnotics Operations, Inc., Indianapolis, IN (US)

( * ) Notice: Subject to any disclaimer, the term of this patent is extended or adjusted under 35 U.S.C. 154(b) by 64 days.

(21) Appl. No.: 12/651,886

(22) Filed: Jan. 4, 2010

(65) Prior Publication Data
US 2010/0172799 A1 Jul. 8, 2010

Related U.S. Application Data

(63) Continuation of application No. PCT/EP2008/057862, filed on Jun. 20, 2008.

(30) Foreign Application Priority Data

Jul. 3, 2007 (EP) .................................... 07111621

(51) Int. Cl.
| | | |
|---|---|---|
| *B01L 99/00* | (2010.01) | |
| *B81C 1/00* | (2006.01) | |
| *B29C 59/16* | (2006.01) | |
| *B01L 3/00* | (2006.01) | |
| *B01J 19/00* | (2006.01) | |

(52) U.S. Cl.
CPC ....... *B81C 1/00206* (2013.01); *B01L 2200/027* (2013.01); *B01L 3/502707* (2013.01); *B01J 19/0093* (2013.01); *B01L 3/5023* (2013.01); *B01L 3/5027* (2013.01); *B29C 59/16* (2013.01); *B29C 2791/009* (2013.01); *B81B 2201/058* (2013.01)
USPC .......................................................... 422/503

(58) Field of Classification Search
CPC ........................ B01J 10/0046; B01L 2200/027
USPC .................................................. 422/502, 503
See application file for complete search history.

(56) References Cited

U.S. PATENT DOCUMENTS

| | | | |
|---|---|---|---|
| 6,271,040 B1 | 8/2001 | Buechler | |
| 6,660,363 B1 | 12/2003 | Barthlott | |
| 7,008,799 B1 | 3/2006 | Zimmer et al. | |
| 2002/0150683 A1* | 10/2002 | Troian et al. | ............ 427/256 |

(Continued)

FOREIGN PATENT DOCUMENTS

| | | |
|---|---|---|
| CA | 2549143 A1 | 6/2005 |
| DE | 19753847 A1 | 6/1999 |

(Continued)

OTHER PUBLICATIONS

Pfleging et al. "Laser-Assisted Modification of Polymers for Microfluidic, Microoptics and Cell Culture Applications", Mar. 8, 2007, SPIE, Laser-based Micro- and Nanopackaging and Assembly, vol. 6459.*

*Primary Examiner* — Paul Hyun
(74) *Attorney, Agent, or Firm* — Krieg DeVault LLP

(57) ABSTRACT

A method is provided for producing a microfluidic system on a polymer surface, wherein at least one portion of the polymer surface is irradiated by laser light in a targeted fashion for the spatially-resolved modification of the wettability of the portion of the polymer surface by a liquid sample.

21 Claims, 4 Drawing Sheets

(56) References Cited

U.S. PATENT DOCUMENTS

| | | |
|---|---|---|
| 2003/0013147 A1 | 1/2003 | Hildenbrand |
| 2003/0044322 A1* | 3/2003 | Andersson et al. ............ 422/100 |
| 2004/0028566 A1* | 2/2004 | Ko et al. ...................... 422/100 |
| 2004/0067166 A1 | 4/2004 | Karinka et al. |
| 2004/0115831 A1* | 6/2004 | Meathrel et al. .............. 436/514 |
| 2004/0265365 A1 | 12/2004 | Daddona et al. |
| 2005/0136217 A1 | 6/2005 | Barthlott et al. |
| 2006/0159838 A1* | 7/2006 | Kowalski et al. ............... 427/58 |
| 2006/0234269 A1 | 10/2006 | Asplund et al. |
| 2007/0110613 A1 | 5/2007 | Pachl et al. |
| 2008/0257355 A1* | 10/2008 | Rao et al. ................. 128/207.14 |
| 2010/0172799 A1 | 7/2010 | Roeper et al. |

FOREIGN PATENT DOCUMENTS

| | | |
|---|---|---|
| GB | 2350678 A | 12/2000 |
| WO | 96/04123 A1 | 2/1996 |
| WO | 98/23957 A1 | 6/1998 |
| WO | 00/58410 A1 | 10/2000 |
| WO | 00/58415 A1 | 10/2000 |
| WO | 01/56771 A2 | 8/2001 |
| WO | 2005/054845 A1 | 6/2005 |
| WO | 2006/074665 A2 | 7/2006 |

* cited by examiner

METHOD FOR THE PRODUCTION OF A MICROFLUIDIC SYSTEM ON A POLYMER SURFACE

CLAIM OF PRIORITY

The present application is a continuation application based on and claiming priority to PCT/EP2008/057862, filed Jun. 20, 2008, which is based on and claims the priority benefit of European Application No. EP 07111621.4, filed Jul. 3, 2007, each of which are incorporated by reference in their respective entireties.

TECHNICAL FIELD OF THE INVENTION

The present application relates to the production of a microfluidic system with a polymer surface, the wettability of which is modified in a targeted fashion in portions thereof, and more particularly to modification of a polymer surface using a laser.

BACKGROUND

Microfluidics concerns the handling of in particular liquids within a very small space. Microfluidic systems are components which are used to move, control and analyze liquids on length scales of below 1 mm. By way of example, microfluidic systems are utilized for applications and measurements in modern biology, biotechnology, biochemistry, the pharmaceutical industry, analytic and clinical chemistry, environmental analysis or in process control.

Microfluidic systems in the form of test elements are often used for analyzing bodily fluids such as blood or urine. The samples to be analyzed are placed on a test element and there they may react with one or more reagents before they are analyzed. The optical, in particular the photometric, and the electrochemical evaluations of test elements constitute common methods for quickly determining the concentration of analytes in the sample. There are different types of test elements, for example there are capillary gap test elements, in which the sample liquid is moved in a transport channel (capillary channel, capillary gap) from a sample application location to a sample detection location, at a distance from said sample application location, using capillary forces in order to undergo a detection reaction at said sample detection location. Capillary gap test elements are disclosed in, for example, CA 2549143 or US 2003/0013147 A1. The typical capillary gap test elements comprise micro-capillaries that have an inner coating of hydrophilic and possibly also of hydrophobic materials. The liquid transport in microfluidic systems can be controlled by hydrophilic and hydrophobic surface properties of the materials contacting the sample liquid. In the prior art, polymer surfaces are functionalized (hydrophobized or hydrophilized), inter alia, by coating, for example from the gas-like, vapor-like, liquid, pulpy, or paste-like state, for example by spraying a suspension, from the ionized state by electrolytic or chemical deposition or from the solid state (i.e. granular or powdered state), for example by powder coating or coating by sintering. Moreover, it is for example known to build test elements from a plurality of foils having different wettabilities and lying on top of one another.

The structuring of a polymer layer by plasma etching or photoablation is also known in the art. Such methods typically have an ablating effect which generate a three-dimensional structure in interconnected polymer layers. The wettability of the structure surface changes depending on which of the polymer layers equipped with various surface properties is adjacent to a structure generated in this fashion. See, for example, WO 01/56771 A2.

It is also known to generate a surface pattern by means of photoablation. By way of example, a biological affinity reagent is applied in the photoablated region. See, for example, WO 98/23957 A1.

The methods for functionalizing the surface disclosed in the prior art can be subdivided into large-scale and spatially-resolved methods. Large-scale methods are disadvantageous in that they may complicate or impede further processing. By way of example, adhesively bonding a layer having certain surface properties results in troublesome adhesive remains. Alternate patterns of hydrophilic and hydrophobic functions (patterning) cannot be produced by large-scale methods. Spatially-resolved methods disclosed in the prior art are complicated and expensive. Producing small dimensions, i.e. a high resolution, is difficult. These spatially-resolved methods can in part only be applied on flat surfaces. There is little flexibility for changing the geometry.

It is the object of the invention to avoid the disadvantages of the prior art. In particular, it is an object of the invention to provide a method for producing a microfluidic system on a polymer surface in which the wettability of at least one portion of the polymer surface is modified in a cost-effective and flexible fashion.

SUMMARY

This object and others that will be appreciated by a person of ordinary skill in the art have been achieved according to the embodiments of the present invention disclosed herein. In one embodiment, the present invention a method for producing a microfluidic system on a polymer surface, wherein at least one portion of the polymer surface is irradiated by laser light in a targeted fashion for the spatially-resolved modification of the wettability of the portion of the polymer surface by a liquid sample.

In the process, the polymer surface can be the surface of a planar carrier, for example in the form of a strip-shaped or a tape-shaped carrier. However, the method according to the invention also affords the possibility of modifying polymer surfaces which are part of an arbitrarily shaped three-dimensional carrier. The carrier can be coated by a polymer or can completely consist of a polymer. The polymer can be a polymer selected from the group comprising polyethylene terephthalate (polyester—PET), polycarbonate (PC), polyether ether ketone (PEEK), polystyrene (PS), polypropylene (PP), polymethyl methacrylate (PMMA), polydimethylsiloxane (PDMS) and cyclic olefin copolymer (COC).

According to one embodiment of the invention, at least one portion of the polymer surface is irradiated by laser light in a targeted fashion. In this context, targeted means that no masks or the like are used but that at least one laser beam is focused onto the portion using suitable optical components and said beam passes over (scans) this portion, and therefore a spatially-resolved modification of the polymer surface is obtained.

The irradiation with laser light is performed to modify the wettability of the portion of the polymer surface. The wettability of the surface (and thus, for example, the flow velocity in a capillary equipped with this surface) can be derived from the contact angle α formed between water (or a water-comprising sample) and the surface. If a liquid drop contacts a solid base, two extreme cases can occur. First, complete wetting can occur, in which the adhesion forces are greater than the cohesion forces. Therefore, the sample will spread over the surface of the solid body. Second, incomplete wetting can occur, in which the adhesion forces are substantially smaller than the cohesion forces. Therefore, the liquid will contract into a spherical drop.

The wettability and hence, for example, the flow velocity of a liquid sample in a capillary increase as the contact angle α decreases. The filling time for filling a capillary per stretch increases exponentially with the contact angle. In the case of water-comprising samples, specifying the contact angle of water suffices to characterize the material-specific capillary properties. By way of example, the microfluidic system according to the invention can utilize this effect by the internal polymer surface of a capillary treated by means of the method according to the invention being subdivided into zones with different wettabilities, and therefore a liquid sample in these zones of the capillary forms different contact angles α and hence continuously flows at different velocities through these zones of the capillary. The length of time that the sample remains in the respective zone and, for example, reacts with reagents placed therein can be influenced in a targeted fashion. It follows that different measurements can be performed in succession in a capillary of a microfluidic system according to the invention (e.g. of a test element); in particular, this also holds true for complex measurements which are made possible by the design of the capillary subdivided into zones and by the time separation of the reaction steps resulting therefrom. In the case of a parallel arrangement of a plurality of capillaries in a test element, it is even possible for various multiple measurements to be performed simultaneously and in parallel using a liquid sample.

The liquid sample can be essentially any water-comprising sample, for example plasma, blood, interstitial fluid, urine, samples from water analysis, in particular sewage, saliva or sweat. The microfluidic system, in one embodiment, comprises diagnostic system.

Inventive modification of the wettability of the portion of the polymer surface means that the laser light effects a change in the contact angle between the liquid sample and the polymer surface in that portion. However, there is no ablation of material during the modification, in particular as a result of the energy density radiated thereon by the laser light lying below the ablation threshold.

According to embodiments of the method according to the invention, laser light achieves a high spatial resolution in respect of the modified portion. As a result of a suitable choice of laser and optical components, a spatial resolution down to the μm range is possible.

In accordance with other embodiments of the method according to the invention, the polymer surface is structured by the irradiation with laser light in the portion irradiated by laser light, that is to say the surface structuring is changed by the laser light. In particular, the polymer surface can be roughened by the irradiation with laser light. A pulsed laser is used for structuring, wherein the pulsed laser beam scans the portion of the polymer surface and the polymer surface is structured by the laser pulses impinging on the polymer surface, spaced apart at a certain distance from one another. A suitable choice of laser parameters (wavelength, power, pulse rate, etc.) affords the possibility of generating microstructures in a targeted fashion, which microstructures for example cause hydrophilic or hydrophobic properties. As a result of the laser light, molten round structures (bumps and recesses) are produced on the polymer surface, the average spacing of which structures (for example from recess to recess) being referred to by the term "hatch distance".

By way of example, portions of the polymer surface of the microfluidic system can be modified by such a structuring such that they have the so-called "lotus effect". Such a surface has bumps and recesses, wherein the distance between the bumps lies in the range of between about 0.1 and about 200 μm and the height of the bumps lies in the range of about 0.1 to about 100 μm, and the bumps are generally hydrophobic.

Furthermore, the portion of the polymer surface can be structured by the laser light such that impurities, such as air molecules, can be included in the generated recesses, as a result of which the polymer surface is hydrophobized.

As an alternative, or in addition, to the structuring of the polymer surface, the polymer surface according to one embodiment of the present invention is changed chemically by the irradiation with laser light, as a result of which the wettability of the irradiated portion of the polymer surface is modified.

By way of example, polar groups which increase the hydrophilic effect can be created on the polymer surface as a result of oxidation processes during the laser treatment.

An example of a chemical change is that both the ratio of O to C and the ratio of ester groups to carboxy groups can be changed in polyester as a result of excimer laser irradiation.

A further possibility for the chemical change comprises separating bonds of the polymer by suitable selection of laser parameters such that fragments of the polymer are present on the treated surface and these modify the wettability of the polymer surface in the irradiated portion.

In accordance with another embodiment of the method according to the invention, at least one portion of the polymer surface is hydrophobized by the irradiation with laser light. By way of example, this portion of the microfluidic system can be used to slow or stop the flow (e.g. within a capillary) of the liquid sample or to prevent wetting of the portion by the liquid sample (e.g. at the sample application). As a result of hydrophobizing a provided hydrophilic polymer surface in one or more portions, it is possible for a hydrophilic-hydrophobic pattern to be generated on the surface.

In accordance with yet another embodiment of the method according to the invention, at least one portion of the polymer surface is hydrophilized by the irradiation with laser light. By way of example, this portion of the microfluidic system can be used to accelerate the flow (e.g. within a capillary) of the liquid sample or to ease wetting of the portion by the liquid sample (e.g. at the sample application). As a result of hydrophilizing a provided hydrophobic polymer surface in one or more portions, it is possible for a hydrophilic-hydrophobic pattern to be generated on the surface.

In one embodiment, a hydrophilic-hydrophobic pattern is generated on the polymer surface by irradiation with laser light with different parameters in different portions of the polymer surface. As a result of a suitable choice of laser and optical components, a spatial resolution down to the μm range is possible for such a hydrophilic-hydrophobic pattern, in which hydrophilic and hydrophobic portions alternate. Hence, the hydrophilic-hydrophobic pattern is generated in a spatially-resolved fashion without using masks and without ablating material from the polymer surface. In contrast to the known methods, such as coating methods, the method according to the invention affords the possibility of implementing, in a targeted fashion, hydrophilic and hydrophobic regions in a diagnostic system in the direct vicinity of one another as a result of the irradiation with laser light. As a result of this, the fluidics control, for example, can easily be controlled in a micro-channel system.

In accordance with yet another embodiment of the present invention, a portion of the polymer surface is irradiated by laser light for modifying the wettability, the diameter of the portion being less than about 4 cm. Smaller such portions are also useful in some embodiments, such as less than about 10 mm, and even as small as less than about 1 mm.

A typical embodiment of the present invention comprises at least one capillary channel being provided in a polymer surface of a carrier and the polymer surface in the interior of the capillary channel being hydrophilized by irradiation with laser light. The capillary channel is used to transport the liquid sample using capillary forces (for example from the sample application zone of a test element to a detection zone of the test element).

In this context, an application zone is a region of the microfluidic system provided for receiving a liquid sample which is transported, mixed, separated, contacted by reagents and/or processed in a different fashion in the microfluidic system. A detection zone is designed such that certain components of the liquid sample, or the reaction thereof with reagents present in the detection zone, can be detected therein. One example of this is a zone in which there is a detection reaction for glucose in a liquid sample (for example a blood sample) and photometric evaluation thereof.

By irradiating the polymer surface in the interior of the capillary channel with laser light, the irradiated region within the capillary channel is hydrophilized in this embodiment variant. As a result, a liquid sample comprising water is transported more rapidly in the hydrophilized region (which typically has a contact angle $\alpha <$ about 30°). The capillary channel in one embodiment has an internal diameter of less than about 3 mm, a length of less than about 15 mm, and a depth of between about 0.04 and about 0.1 mm. In another embodiment, the capillary channel has an internal diameter of less than about 1.5 mm, a length of less than about 7 mm, and a depth of about 0.07 mm. In the case of the targeted irradiation of the polymer surface within the interior of the capillary channel, the surroundings of the micro-channel remain untreated. However, said surroundings can also be hydrophobized in a targeted fashion by using a laser. An advantage of the method according to the invention is that it is not only planar surfaces that can be treated by laser. It is also possible for the laser beam to reach deep structures (such as micro-channels) in order to functionalize the surface of the channel by the laser light.

It is typical for embodiments of the present invention that provision to be made for a carrier composed of a polymer, with the at least one capillary channel being stamped out of said carrier. A carrier made of solid polymer has the advantage that no other layers of the carrier can be damaged during the stamping. The prior art often uses carriers with a plurality of layers which can, for example, comprise adhesive tapes. In the process, a capillary channel is stamped into the carrier such that, for example, a hydrophobic cover layer is stamped out in the region of the channel and a hydrophilic layer lying therebelow is uncovered in the region of the channel. On the one hand, the hydrophilic layer is usually damaged or at least mechanically strained in the process and, on the other hand, troublesome adhesive layers are often uncovered in the region of the channel. In contrast thereto, the method according to the invention has the advantage that the production processes are simplified. Additional coating steps or the use of auxiliary materials (such as adhesive tapes) are/is dispensed with. Stamping processes for generating the micro-channel (for example, the kiss-cut process) are very much simplified since there are no troublesome coatings in the channel. The micro-channel is only subsequently treated by the laser and hydrophilized as a result thereof.

In accordance with another embodiment of the present invention, a test element for determining an analyte in a liquid is produced and comprises a carrier with a polymer surface, an application zone for a sample of the liquid, a detection zone for determining the analyte and a capillary channel for transporting the sample from the application zone into the detection zone, wherein the polymer surface is hydrophobized in a region around the application zone by irradiation with laser light. As a result of the hydrophobization in the region around the application zone in which the opening of the capillary channel is located and onto which a user applies e.g. blood, excess blood is either suctioned into the capillary channel or drips off the hydrophobized region and so only the capillary channel of the test element is wetted and a contamination of the edge region of the test element and of measurement equipment holding the test element is avoided. The surface hydrophobized by the laser light can for example be a lotus effect surface.

The invention furthermore relates to embodiments of a microfluidic system, in particular a test element, which is produced using the method according to the invention. The microfluidic system according to the invention has a polymer surface, the wettability by a liquid sample being modified in at least a portion of said surface as a result of irradiation with laser light. Generally, there is at least one portion hydrophilized by laser light and/or at least one portion hydrophobized by laser light, in particular a hydrophilic-hydrophobic pattern, on the polymer surface of the microfluidic system.

EXAMPLES

According to the invention, portions of the surfaces of two polyester foils (PET) are irradiated by laser light. Untreated PET is hydrophobic and has a contact angle of approximately 74°. Two types of polyester are examined (Melinex, 350 µm thick, and Hostaphan, 12 µm thick). The following three laser systems are applied to Melinex:
  A diode-pumped solid state laser in the 4f mode: wavelength 266 nm, pulse width 25 ns, repetition rate 30 kHz, pulse energy 10 µJ, hatch distance (=laser spot overlap, corresponding to the mean structure spacing, for example from trough to trough) 6 µm, beam diameter 18 µm;
  A regenerative amplifier picosecond laser: wavelength 1064 nm, pulse width 12 ps, repetition rate 50 kHz, pulse energy 30 µJ, hatch distance 12 µm, beam diameter 20 µm; and
  A KrF excimer laser: wavelength 248 nm, pulse width 30 ns, repetition rate 100 Hz, pulse energy 400 to 500 mJ, hatch distance 10 µm, beam diameter 10 µm.

Hostaphan is likewise treated by the abovementioned 4f laser with 266 nm.

For the purpose of evaluating the surface modifications by the laser light, use is made of a CCD camera (wetting recognition), a scanning electron microscope—SEM (morphology), an atomic force microscope—AFM (roughness) and an optical microscope. The contact angles in the portions post laser treatment are <5° in all cases.

Typical values for the depth profiles (topography) are approximately 5 to 6 µm for Melinex after irradiation with the 1064 nm picosecond laser.

Furthermore, the assumption can be made that there are chemical modifications of the surfaces, for example as the result of oxidations and rearrangements (from ester groups into carboxy groups in the case of polyester).

The invention is to be explained in more detail by the following figures and examples.

BRIEF DESCRIPTION OF THE DRAWINGS

The following detailed description of the embodiments of the present invention can be best understood when read in conjunction with the following drawings, where like structure is indicated with like reference numerals and in which.

In order that the present invention may be more readily understood, reference is made to the following detailed descriptions and examples, which are intended to illustrate the present invention, but not limit the scope thereof.

DETAILED DESCRIPTION OF EMBODIMENTS OF THE PRESENT INVENTION

The following descriptions of the embodiments are merely exemplary in nature and are in no way intended to limit the present invention or its application or uses.

Figure 1A:
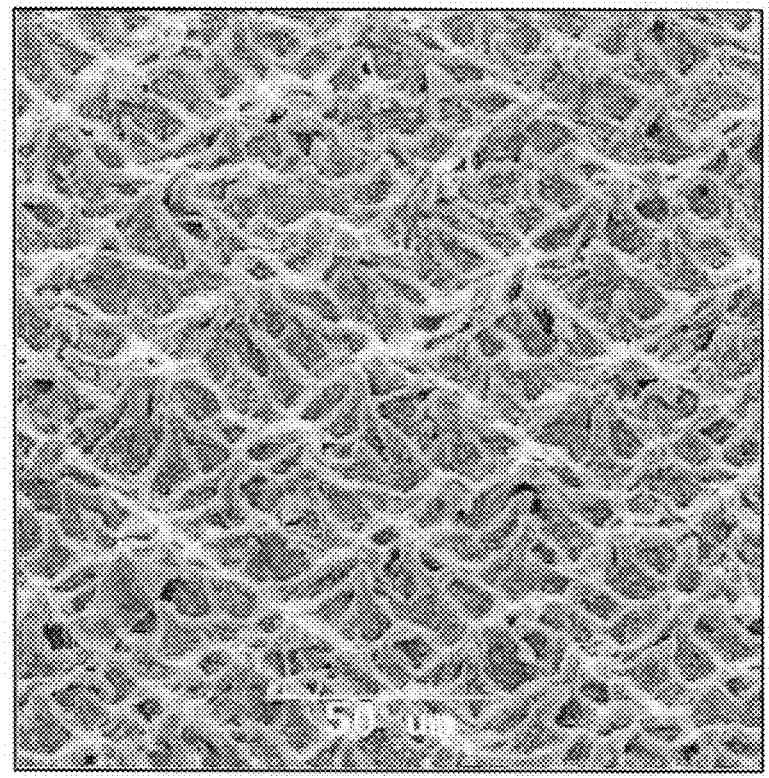
FIGS. 1A and 1B show, in two different enlargements, a portion of a polymer surface irradiated with laser light in accordance with the method according to the invention.
Figure 1B:
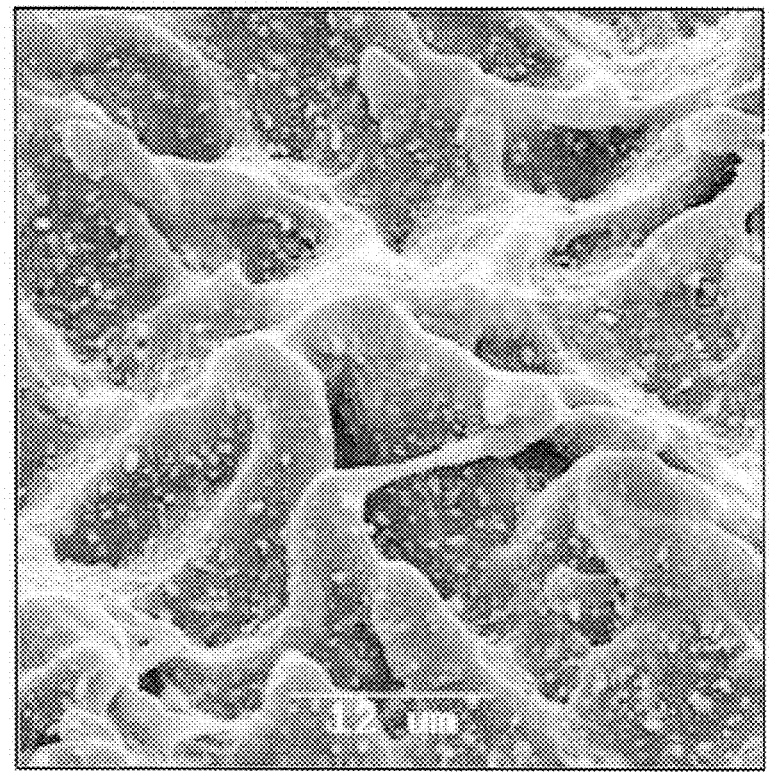

FIGS. 1A and 1B show two different enlargements of a laser-structured PET foil with hydrophilic properties. As a result of irradiating the illustrated portion of the polymer surface with laser light, molten round microstructures were produced in a targeted fashion which cause hydrophilic characteristics.

FIGS. 2A to 2D show different microfluidic systems according to the invention, which can be produced in accordance with the method according to the invention.

Figure 2A:
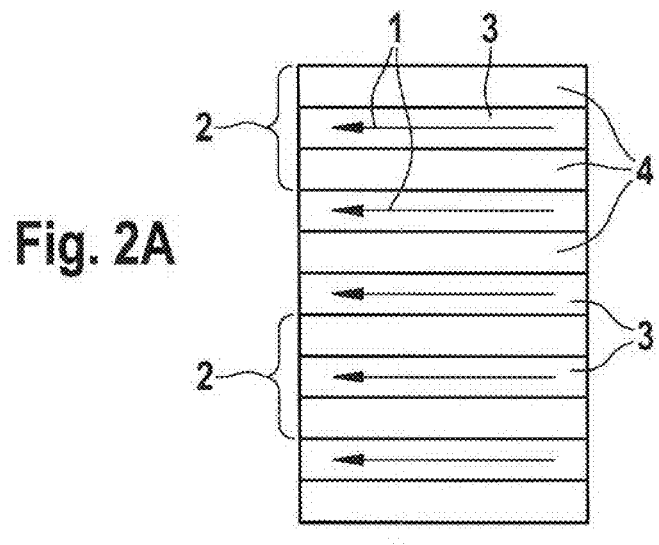
FIGS. 2A through 2D schematically show different hydrophilic-hydrophobic patterns of microfluidic systems which can be produced in accordance with the method according to the invention.

FIG. 2A illustrates five microfluidic systems 2 arranged parallel to one another. The arrow 1 in each case represents the transport direction of a liquid sample (not illustrated) through the microfluidic system 2. The microfluidic system 2 in each case has a hydrophilic-hydrophobic pattern such that a hydrophilic region 3 running in the longitudinal direction is flanked by two hydrophobic regions 4 which run parallel thereto. In order to produce this hydrophilic-hydrophobic pattern, a hydrophobic PET surface is for example irradiated with laser light (e.g. in accordance with the abovementioned examples) in those portions which are modified to form the hydrophilic regions 3. The microfluidic systems 2 can be separated by for example cutting through (e.g. stamping) the middle of the hydrophobic regions 4.

Figure 2B:
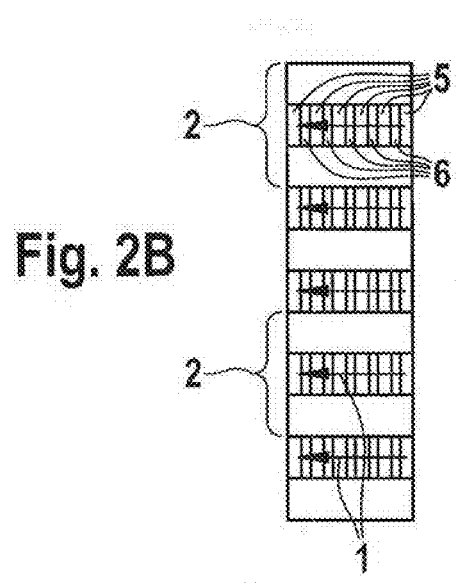

FIG. 2B likewise illustrates five microfluidic systems 2 arranged parallel to one another. Zones 5, which have a smaller contact angle α (such as α<about 30°) in respect of water, and zones 6, which have a larger contact angle α (such as about 30°<α<about 90°) in respect of water, alternate in the transport direction 1 along which a liquid sample is transported through the respective microfluidic system 2 as a result of capillary forces. In this context, a "smaller" contact angle means that it has a smaller value relative to the "larger" contact angle, wherein the smaller contact angle can, in particular, lie between about 0° and about 30° and the larger contact angle can lie between about 30° and about 90°. The zones which have smaller contact angles, such as α<about 30° in respect of water, are more rapid filling stretches, each one followed by a slower filling stretch with a greater contact angle α, such as α>about 30°. The contact angle in the zones with α>about 30° in respect of water is typically about 50° to about 85° for water. In every microfluidic system 2, these zones 5, 6 are flanked by two hydrophobic regions 4 running parallel to the transport direction 1. The zones 5, 6 in one exemplary embodiment lie in a capillary gap.

In other embodiments, the zones 5, 6 which follow one another in a capillary in the transport direction, comprise at least one reaction, enrichment or detection zone and at least one delay zone, the capillary expediently having one delay zone lying in each case between two differing zones. A reaction zone in this case is a zone in which the liquid sample reacts with reagents placed therein. This can, for example, include preliminary reactions, suppression reactions, or fields for reagent separation. In an enrichment zone, a constituent of the liquid sample is enriched. A detection zone is designed such that certain constituents of the liquid sample, or their reaction with the reagents, can be detected therein. One example of this is a zone in which there is a detection reaction for glucose in a blood sample and the photometric determination thereof. In a delay zone, the flow of the sample is slowed down (as a result of a larger contact angle) and so it reaches the zone following on from a delay zone in the transport direction 1 only with a time delay. In the reaction, enrichment and detection zones, the sample is distributed rapidly (as a result of a smaller contact angle) so that it can react with the reagents placed there. In the delay zones, the sample is intended to flow more slowly so that it needs a certain amount of time to move from the preceding zone through the respective delay zone. Therefore, the contact angle □ with water is smaller in the reaction, enrichment or detection zones (for more rapid filling) and larger in the delay zones (for "holding back" the sample, i.e. for slow tilling). Expediently (but not necessarily), a delay zone lies in each case between two different zones for "separating" reactions in the two other zones.

According to the invention, the hydrophilic-hydrophobic pattern of the zones 5, 6 and of the regions 4 on a polymer surface is produced by targeted irradiation of portions of the polymer surface using laser light, as a result of which a spatially-resolved modification of the wettability of the portions by a liquid sample is achieved.

Figure 2C:
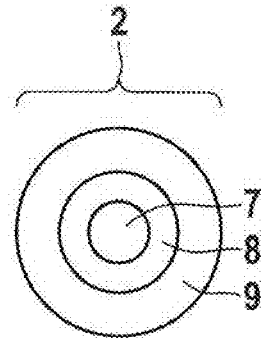

FIG. 2C schematically shows a microfluidic system 2 acting as a hydrophobic barrier. The system has a hydrophilic inner region, comprising at least one hydrophilic inner portion 7, and optionally a second such inner portion 8, which is surrounded by an annular hydrophobic outer portion (which can be referenced in the figures as portion 8 or 9 depending on whether portion 8 comprises an optional second hydrophilic inner portion). Such hydrophobic barriers are important components of a diagnostic system in respect of hygiene aspects and the function of the diagnostic system. According to the invention, the individual portions 7, 8, 9 are hydrophilized or hydrophobized by targeted irradiation of a polymer surface by laser light.

Figure 2D:
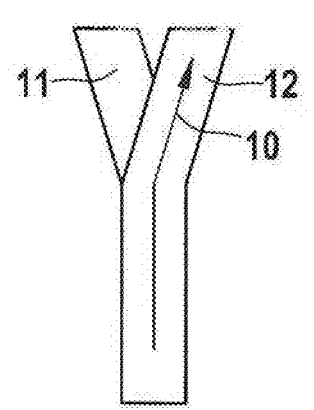

FIG. 2D schematically shows a further microfluidic system 2 that can be produced by the method according to the invention, in which system the flow direction 10 of a liquid sample through the hydrophilic-hydrophobic pattern can be controlled. A hydrophobic portion 11 prevents the flow of a liquid sample in this region of the polymer surface. Instead, the sample flows along the hydrophilic portion 12.

Figure 3A:
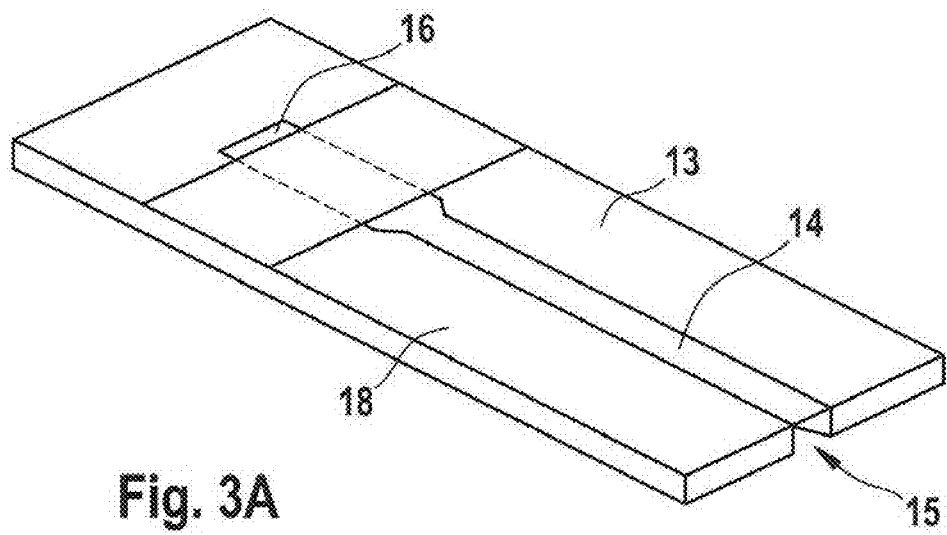
FIGS. 3A and 3B schematically show a test element which can be produced in accordance with the method according to the invention.

FIG. 3A shows a test element 13 produced in accordance with the method according to the invention. The test element 13 has a carrier 18 and a capillary channel 14 located in said carrier 18, said channel running from an application zone 15 for a liquid sample to a detection zone 16 for determining an analyte in the sample. The carrier 18 comprises a polymer, such as PET. The polymer surface in the interior of the capillary channel 14 was hydrophilized by irradiation with laser light.

Figure 3B:
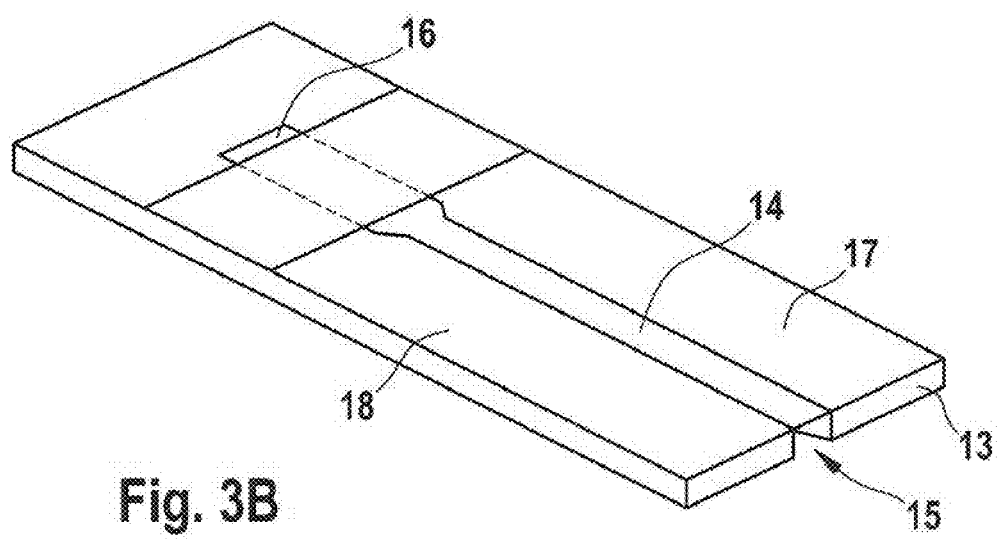

FIG. 3B shows a test element 13 with a design corresponding to that of FIG. 3A, in which, additionally, the polymer surface 17 in the vicinity of the capillary channel 14, particularly in the region around the application zone 15, has been hydrophobized by irradiation with laser light.

The features disclosed in the above description, the claims and the drawings may be important both individually and in any combination with one another for implementing the invention in its various embodiments.

It is noted that terms like "preferably", "commonly", and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Having described the present invention in detail and by reference to specific embodiments thereof, it will be apparent that modification and variations are possible without departing from the scope of the present invention defined in the appended claims. More specifically, although some aspects of the present invention are identified herein as preferred or particularly advantageous, it is contemplated that the present invention is not necessarily limited to these preferred aspects of the present invention.

What is claimed is:

1. A method for producing a microfluidic system on a polymer surface wherein at least one portion of the polymer surface is irradiated by laser light in a targeted fashion for the spatially-resolved modification of the wettability of the portion of the polymer surface by a liquid sample, the method comprising irradiating at least one portion of the polymer surface with laser light having different parameters for each of the at least one portions, thereby generating a hydrophilic-hydrophobic pattern on the polymer surface, wherein at least a first one of the portions of the polymer surface is hydrophobized by the laser light, at least a second one of the portions of the polymer surface is hydrophilized by the irradiation with laser light, and the laser light comprises an intensity below an ablation threshold of the polymer.

2. The method as claimed in claim 1, wherein each of the at least one portions of the polymer surface irradiated with the laser light are thereby structured.

3. The method as claimed in claim 1, wherein each of the at least one portions of the polymer surface irradiated with the laser light are thereby changed chemically.

4. The method as claimed in claim 1, wherein one of the at least one portions of the polymer surface irradiated with the laser light includes a diameter less than about 4 cm.

5. The method as claimed in claim 1, wherein the first one of the portions is configured to slow or stop the flow of the liquid sample or to prevent wetting of the first one of the portions by the liquid sample.

6. The method as claimed in claim 1, wherein the polymer surface is provided in an interior of a capillary channel of a carrier, and wherein at least a second one of the portions of the polymer surface is hydrophilized by irradiation with laser light.

7. The method as claimed in claim 6, wherein the carrier comprises a polymer, and wherein the capillary channel is stamped out of said carrier.

8. The method as claimed in claim 1, further comprising producing a test element for determining an analyte in a liquid from a carrier including the polymer surface, the test element further comprising an application zone configured to receive the liquid sample, a detection zone configured to determine the analyte, and a capillary channel configured to transport the liquid sample from the application zone into the detection zone, wherein the first one of the portions of the polymer surface which is hydrophobized by irradiation with laser light is located around the application zone.

9. A microfluidic system produced according to the method as claimed in claim 1, comprising a polymer surface, wherein the polymer surface has a wettability by a liquid sample in at least one portion, the wettability being modified by irradiation with laser light.

10. The method of claim 1, which further includes irradiating a second one of the portions of the polymer surface with the laser light, wherein the first one of the portions of the polymer surface is hydrophobized by the laser light having a first set of parameters and the second one of the portions of the polymer surface is hydrophilized by the laser light having a second set of parameters different from the first set of parameters.

11. A method for producing a hydrophilic-hydrophobic pattern on a polymer surface, comprising irradiating a first portion of the polymer surface with laser light below an ablation threshold of the polymer to hydrophilize the first portion of the polymer surface and irradiating a second portion of the polymer surface with the laser light below an ablation threshold of the polymer to hydrophobize the second portion of the polymer surface.

12. The method of claim 11, wherein the polymer surface is on a test element configured for determining an analyte in a liquid.

13. The method of claim 12, wherein the laser light includes a first set of parameters for irradiating the first portion of the polymer surface and a second set of parameters for irradiating the second portion of the polymer surface, the first set of parameters being different from the second set of parameters.

14. The method of claim 11, wherein the first portion of the polymer surface is adjacent to the second portion of the polymer surface.

15. A method, comprising hydrophobizing a first portion of a surface of a polymer by irradiating the first portion of the surface with laser light; and hydrophilizing a second portion of the surface of the polymer by irradiating the second portion of the surface with the laser light; wherein the hydrophobizing includes non-ablatively irradiating the first portion of the surface and the second portion of the surface.

16. The method of claim 15, wherein the surface is on a test element configured for determining an analyte in a liquid.

17. The method of claim 16, wherein a portion of the polymer surface located around an application zone is hydrophobized by the laser light.

18. The method of claim 17, wherein the portion of the polymer surface located around the application zone is configured to slow or stop the flow of the liquid sample or to prevent wetting by the liquid sample.

19. A method, comprising:
providing a test element for determining an analyte in a liquid sample, the test element including a polymer surface, an application zone configured to receive the liquid sample, a detection zone configured to determine the analyte, and a capillary channel configured to transport the liquid sample from the application zone into the detection zone; and producing a microfluidic system on the polymer surface wherein at least one portion of the polymer surface is irradiated by laser light in a targeted fashion for the spatially-resolved modification of the wettability of the portion of the polymer surface by a liquid sample, the method comprising irradiating at least one portion of the polymer surface with laser light having different parameters for each of the at least one portions, thereby generating a hydrophilic-hydrophobic pattern on the polymer surface, wherein a portion of the polymer surface located around the application zone is hydrophobized by the laser light.

20. A method, comprising:

providing a test element for determining an analyte in a liquid sample, the test element including a polymer surface, an application zone on the polymer surface and configured to receive the liquid sample, a detection zone configured to determine the analyte, and a capillary channel configured to transport the liquid sample from the application zone into the detection zone; and producing a microfluidic system on the polymer surface wherein at least one portion of the polymer surface is irradiated by laser light in a targeted fashion for the spatially-resolved modification of the wettability of the portion of the polymer surface by a liquid sample, the method comprising irradiating at least one portion of the polymer surface with laser light having different parameters for each of the at least one portions, thereby generating a hydrophilic-hydrophobic pattern on the polymer surface, wherein a portion of the polymer surface located around the application zone is hydrophobized by the laser light and configured to slow or stop the flow of the liquid sample or to prevent wetting by the liquid sample.

21. A method, comprising:

providing a test element for determining an analyte in a liquid sample, the test element including oppositely positioned upper and lower surfaces, a face extending between the upper and lower surfaces, a polymer surface, an application zone positioned on the face and configured to receive the liquid sample, a detection zone configured to determine the analyte, and a capillary channel configured to transport the liquid sample from the application zone into the detection zone; and producing a microfluidic system on the polymer surface wherein at least one portion of the polymer surface is irradiated by laser light in a targeted fashion for the spatially-resolved modification of the wettability of the portion of the polymer surface by a liquid sample, the method comprising irradiating at least one portion of the polymer surface with laser light having different parameters for each of the at least one portions, thereby generating a hydrophilic-hydrophobic pattern on the polymer surface, wherein a portion of the polymer surface located around the application zone is hydrophobized by the laser light and configured to slow or stop the flow of the liquid sample or to prevent wetting by the liquid sample.

* * * * *